US 6,655,574 B2

(12) United States Patent
Schouten et al.

(10) Patent No.: US 6,655,574 B2
(45) Date of Patent: Dec. 2, 2003

(54) APPARATUS FOR SELECTIVE SOLDERING

(75) Inventors: Gerrit Schouten, Oosterhout (NL); Fransiscus H. C. Benning, Oosterhout (NL); Lambertus P. C. Willemen, Dorst (NL)

(73) Assignee: Vitronics Soltec B.V., Oosterhout (NL)

( * ) Notice: Subject to any disclaimer, the term of this patent is extended or adjusted under 35 U.S.C. 154(b) by 1 day.

(21) Appl. No.: 10/119,289

(22) Filed: Apr. 10, 2002

(65) Prior Publication Data

US 2002/0162879 A1 Nov. 7, 2002

(30) Foreign Application Priority Data

Apr. 12, 2001 (NL) .............................. 1017843

(51) Int. Cl.⁷ .......................... B23K 31/02; B23K 37/00
(52) U.S. Cl. ........................ 228/37; 228/43; 228/260
(58) Field of Search ................. 228/256, 260, 228/33, 37, 43

(56) References Cited

U.S. PATENT DOCUMENTS

| | | | | |
|---|---|---|---|---|
| 4,019,671 A | * | 4/1977 | Akyuerek | 228/123.1 |
| 4,072,777 A | * | 2/1978 | Schoenthaler | 427/433 |
| 4,171,761 A | * | 10/1979 | Boldt et al. | 228/37 |
| 4,530,458 A | * | 7/1985 | Kondo | 228/180.1 |
| 4,685,605 A | * | 8/1987 | Spigarelli et al. | 228/37 |
| 4,700,878 A | * | 10/1987 | Ciniglio | 228/37 |
| 5,145,531 A | * | 9/1992 | Turner et al. | 148/23 |
| 5,156,324 A | * | 10/1992 | Hueste et al. | 228/180.1 |
| 5,176,312 A | * | 1/1993 | Lowenthal | 228/180.1 |
| 5,340,013 A | * | 8/1994 | Poole et al. | 228/119 |
| 5,439,158 A | * | 8/1995 | Sund | 228/37 |
| 5,480,483 A | * | 1/1996 | Velie | 118/45 |
| 5,509,598 A | * | 4/1996 | Nayar et al. | 228/180.1 |
| 5,611,480 A | * | 3/1997 | Ciniglio et al. | 228/180.1 |
| 5,615,828 A | * | 4/1997 | Stoops | 228/223 |
| 5,617,988 A | * | 4/1997 | Willemen | 228/37 |
| 5,772,101 A | * | 6/1998 | Nishimura et al. | 228/37 |
| 6,168,065 B1 | * | 1/2001 | Willemen | 228/9 |
| 6,234,380 B1 | * | 5/2001 | Heine | 228/219 |
| 2002/0162879 A1 | * | 11/2002 | Schouten et al. | |
| 2003/0080174 A1 | * | 5/2003 | Toba | |

FOREIGN PATENT DOCUMENTS

| | | | |
|---|---|---|---|
| DE | 4314241 A1 | * | 11/1994 |
| DE | 19541340 A1 | * | 5/1997 |
| DE | 19807696 A1 | * | 9/1999 |
| EP | 0109088 A1 | * | 6/1984 |
| NL | 1017843 | * | 5/2001 |

* cited by examiner

Primary Examiner—Tom Dunn
Assistant Examiner—Kiley Stoner
(74) Attorney, Agent, or Firm—Banner & Witcoff, Ltd.

(57) ABSTRACT

The invention relates to a soldering apparatus, including a vessel for containing and heating molten solder, transporting means for transporting objects for soldering to the vessel and removing said objects, at least one tube extending substantially vertically above the soldering vessel, pump means for feeding molten solder to the underside of the tube, and moving means for moving into at least the vicinity of each other the underside of the printed circuit board for soldering and the upper side of the tube, wherein an outflow opening is arranged in each of the tubes at some distance from the upper side of said tubes. By arranging the outflow opening at some distance from the upper side of the tube the outflowing solder flow will no longer contact the printed circuit board and the components present thereon thus allowing more freedom in the design of the printed circuit board and the placing of the components thereon. Heat transfer to the solder on the upper side of the tube takes place through heat flow inside the solder from the thermal contact with the solder flowing thereunder out of the outflow opening.

22 Claims, 6 Drawing Sheets

APPARATUS FOR SELECTIVE SOLDERING

CROSS-REFERENCE TO RELATED APPLICATIONS

This application is based upon and claims the benefit of priority from the prior Dutch Patent Application No. 1017843, filed Apr. 12, 2001. The entire disclosure of the prior application is incorporated herein by reference.

BACKGROUND OF THE INVENTION

The invention relates to the soldering of components onto printed circuit boards.

Increasing use is being made in recent times of so called surface mounted components which generally have small dimensions and which are soldered onto a printed circuit board by means of a reflow soldering process.

On a large number of printed circuit boards there are however components present for which the reflow process is less suitable. These are generally components such as connectors and electrolytic condensers which are provided with conventional connecting wires and wherein, in order to ensure a fixing and electrical connection of the component to the printed circuit board, the connecting wires extend through openings arranged in the printed circuit board to below the underside of the circuit board. On the underside, a soldered connection must then be made to the tracks present on the underside of the circuit board.

Particularly when a printed circuit board is provided with components on both sides, it is not always possible to make use of a classical wave soldering process for this purpose; this could after all unsolder or destroy the components previously mounted by means of a reflow process.

So as to avoid these problems, a soldering apparatus is known, comprising:

- a vessel for containing and heating molten solder;
- transporting means for transporting objects for soldering over the vessel;
- at least one tube extending substantially vertically above the soldering vessel;
- pump means for feeding molten solder to the underside of the tube; and
- moving means for moving into at least the vicinity of each other the underside of the objects for soldering and the upper side of the tube.

The tube thus forms a kind of small wave soldering apparatus inside which one or more connecting wires can be soldered simultaneously. It is herein possible to carry out the soldering process only at the locations where this is desired, i.e., at the locations where for instance the connecting wires of connectors or electrolytic condensors or other large components extend through openings arranged in the printed circuit board to below the underside of the circuit board. The remaining parts of the underside of the printed circuit board are herein not exposed to solder, so that the components present there are not removed or destroyed.

This prior art apparatus nevertheless has one drawback, this being that, in order to ensure a sufficiently high temperature at the top part of the tube so that a good soldered connection is obtained, a flow of molten solder must be maintained through the tube. The solder herein serves as carrier of the heat necessary for the soldering process and as constant source for feeding solder to the connection.

According to the prior art a smaller or larger recess is herein made in the upper edge of the tube. A flow of solder can hereby be maintained even when the top part of the tube is moved into the vicinity of the underside of the printed circuit board or against it. A quantity of solder herein exits laterally at the position of the smaller or larger recess. This means that in the design of the printed circuit board space must be allowed for this outflowing stream of solder; no components may after all be present at this location. The soldering apparatus can consist of one or more tubes. The tube cross-section is adapted if necessary to the parts for soldering.

SUMMARY OF THE INVENTION

The object of the present invention is to provide such a soldering apparatus wherein these drawbacks are obviated.

This objective is achieved in that an outflow opening is arranged in each of the tubes at some distance from the upper side of said tubes.

By arranging this outflow opening at some distance from the upper side of the tube the outflowing stream of solder will no longer contact the printed circuit board for soldering and the components present thereon, thus allowing more freedom in the design of the printed circuit board and the placing of the components thereon.

It is pointed out here that the heat transfer to the solder on the upper side of the tube takes place through heat flow inside the solder resulting from the thermal contact with the solder flowing thereunder out of the outflow opening. Experience has shown that, with a careful choice of the distance in question, the fact that the solder does not flow over the upper edge of the tube does not have to be a drawback, and that it is hereby possible to obtain a soldered connection of good quality. For the moment a distance is assumed of 10–18 mm, preferably 12–15 mm. This assumes a tube height of about 40 mm.

According to a first preferred embodiment the moving means are adapted to cause the upper side of the tube to contact the underside of the printed circuit boards for soldering.

This embodiment is particularly suitable for tube materials which result in a concave or flat meniscus of the solder, wherein the pressure generated by the solder pump pushes the solder against the printed circuit board. In contrast hereto, it is also possible to place the upper side of the tube a short distance from the printed circuit board; this is intended for situations where the solder has a convex meniscus.

Although the invention can be applied in a situation where only one component has to be selectively soldered, wherein only one tube is necessary, it is also possible that a larger number of tubes is required because a larger number of separate components must be soldered.

In such a situation it is attractive if each of the tubes is fixed with its underside to the same substantially horizontal plate. This situation will result in a considerable simplification of the, moving means for moving each of the tubes in substantially vertical direction, or during the movement of the soldering side of the printed circuit board wherein dimensional tolerances in the product for soldering are otherwise difficult to overcome.

According to another preferred embodiment a number of spacers are present on the plate.

The position of the circuit board in relation to the upper sides of the tubes can hereby be determined precisely. Use is in any case usually made of robots to place the printed circuit board at the soldering position.

A more specific embodiment teaches that the height of the spacers is adjustable.

It is hereby possible to precisely adjust the distance between the upper side of the tube and the printed circuit board. Although it is attractive in most cases to have these make contact, it is better in some cases, depending on material of the tube and solder type, to leave a small distance clear between the upper side of the tube and the underside of the circuit board.

In order to obtain an optimal soldering temperature it is attractive if the pump means are adapted to temporarily increase the pump capacity during the soldering operation.

The solder flow rate is hereby increased temporarily, so that at the top of the tube, where the soldering process must take place, "fresh", non-oxidized solder coming from the soldering vessel is available which has the correct temperature.

According to another preferred embodiment the pump means are adapted to temporarily increase the pump capacity prior to soldering to a value which is higher than the value during soldering.

This embodiment shortens the process of "flushing" the solder in the solder tower and preheating thereof.

It is noted here that the pump capacity at rest is relatively low. The solder level in the tube hereby remains below the lateral outflow opening, whereby solder will no longer flow out of the tube and fewer solder oxides will thus be formed.

According to a specific preferred embodiment the size of the outflow openings is adjustable.

During performing of the soldering process the flow rate out through the outflow opening is a very decisive factor in the constant level of the solder in the tubes. Particularly in the case of types of component with which little experience has yet been acquired, it is attractive to be able to set as many variables as possible. The size of the outflow opening is one of these variables so that it is good to be able to adjust the size of this opening.

According to a further embodiment a sleeve is arranged around or inside at least one of the tubes with an adjustable outflow opening, which sleeve extends at least over the outflow opening, wherein the sleeve is provided with an opening and wherein the sleeve is movable between a position in which the opening in the sleeve coincides with the outflow opening and a position in which the opening in the sleeve at least partially covers the outflow opening.

This represents an attractive embodiment in the situation with an adjustable outflow opening.

According to a further preferred embodiment the upper side of the tubes is covered with a grid. It is the intention with this construction to also reduce the formation of whiskers and bridges. A grid is not only understood to mean a structure of intersecting elongate elements, but also for instance a honeycomb structure or a structure of parallel extending elongate elements.

According to another preferred embodiment the plate is divided into separate elements which are individually exchangeable.

This construction results in a simplification of logistics; when the location of a component or group of components on a printed circuit board is changed, only a part of the whole plate with the tubes arranged thereon has to be replaced.

According to a specific embodiment hereof the elements of the plate are placed on a frame. This construction results in a greater rigidity of the base on which the tubes are placed, so that sagging of the plate and the associated drawbacks are avoided.

In this way a plurality of base plates with tubes can be mounted on the frame, so that a plurality of separate embodiments of a printed circuit board can be soldered without base plates having to be exchanged for the purpose.

It is the intention to carry out the soldering process with a minimum of flux. It is then essential or at least attractive to expel the oxygen from the environment of the soldering process.

According to an embodiment adapted for this purpose, supply means for low-oxygen gas such as nitrogen are arranged in the vicinity of the soldering vessel.

The ability to work without further "confinement" of the low-oxygen gas requires a high flow rate of low oxygen gas, which has a cost-increasing effect and aerodynamic effects have an adverse effect on the action of the low-oxygen gas.

In order to prevent this, a cover plate is arranged according to a specific preferred embodiment above the supply means, which cover plate is removable when a soldering operation is performed. This plate can for instance be pushed away to the side.

It is however also possible that the cover plate be provided with apertures and that the cover plate be vertically movable to a position below the level of the upper part of the tubes. Both solutions have the drawback that the movement of the plate results in the escape of low-oxygen gas to the environment.

An attractive further embodiment therefore provides the measure that around the supply means there is arranged a screen, the upper edge of which corresponds with the contour of the printed circuit board for soldering. The movement of the cover plate is hereby dispensed with, while a kind of confining box is formed by the screen, the solder bath and the printed circuit board.

According to yet another embodiment the upper edge of the screen is manufactured from flexible material. A good fitting to the printed circuit board is hereby obtained so that the least possible low-oxygen gas leaks away.

Gas and solder are added to the space inside the box. The excess volume is discharged via gaps formed, according to a preferred embodiment, between the screen and the solder bath.

Other attractive preferred embodiments are stated in the remaining sub-claims.

BRIEF DESCRIPTION OF THE DRAWINGS

The present invention will be elucidated hereinbelow with reference to the annexed figures, in which.

DETAILED DESCRIPTION OF THE INVENTION

Figure 1:
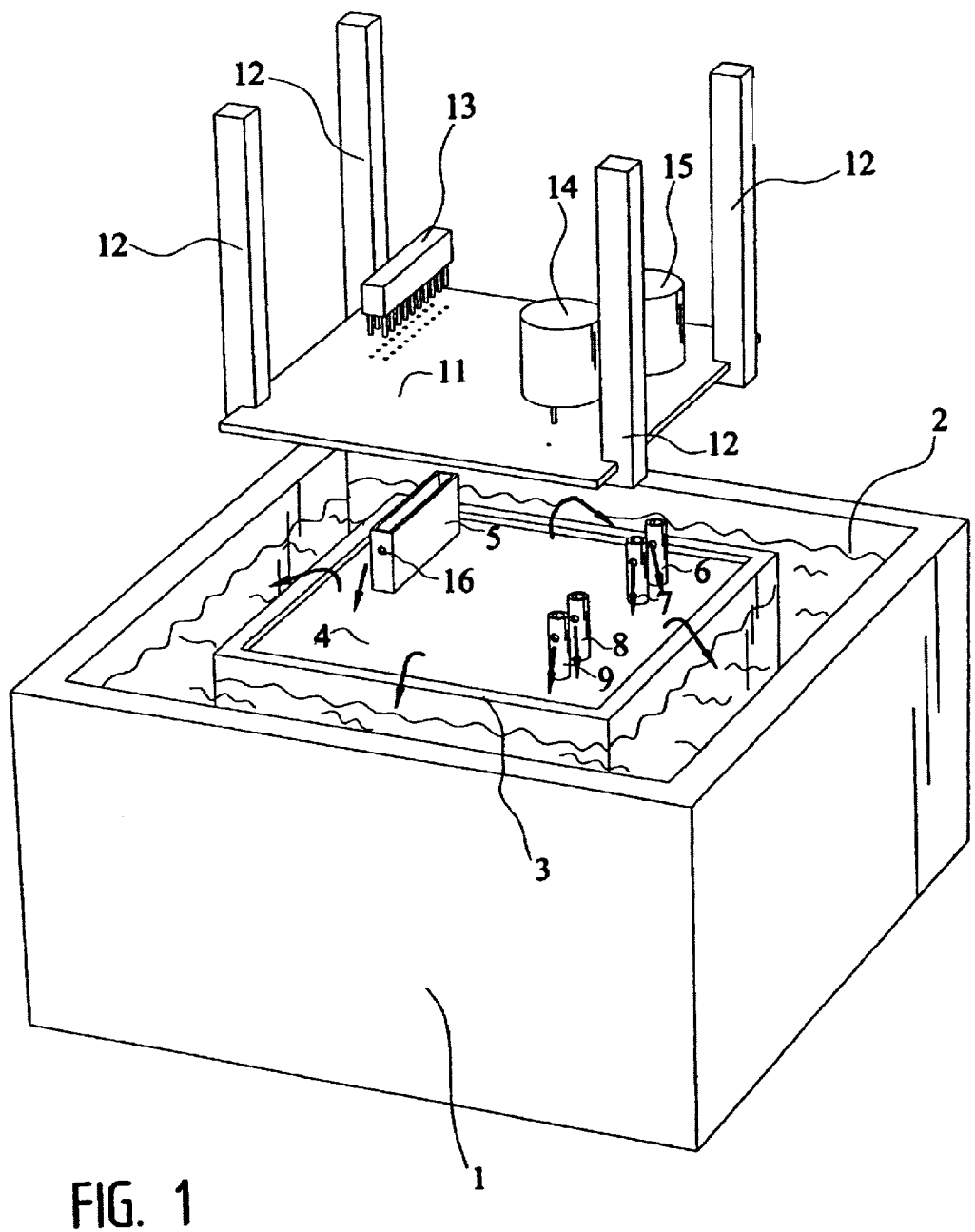
FIG. 1 shows a schematic view of an apparatus according to the invention.
Figure 2:
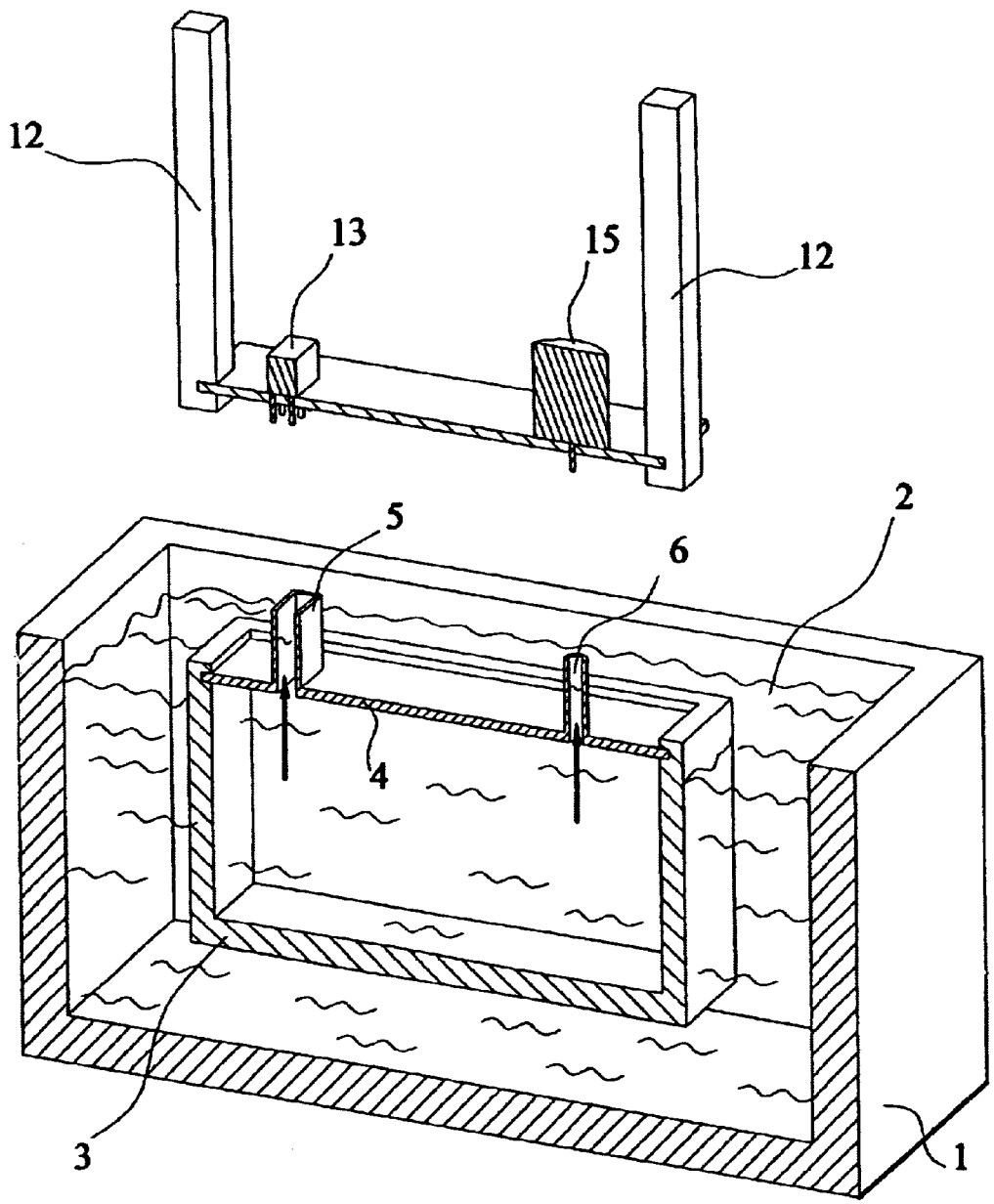
FIG. 2 is a cross-sectional view of the apparatus shown in FIG. 1.

FIG. 1 shows a soldering vessel 1 filled with molten solder 2. Prior art heating means not shown in the drawing are present for melting the solder and keeping it melted.

A solder tank 3 is placed in the middle of soldering vessel 1. This tank is closed at the top by a plate 4. A number of tubes 5–9 is placed on plate 4.

Figure 4:
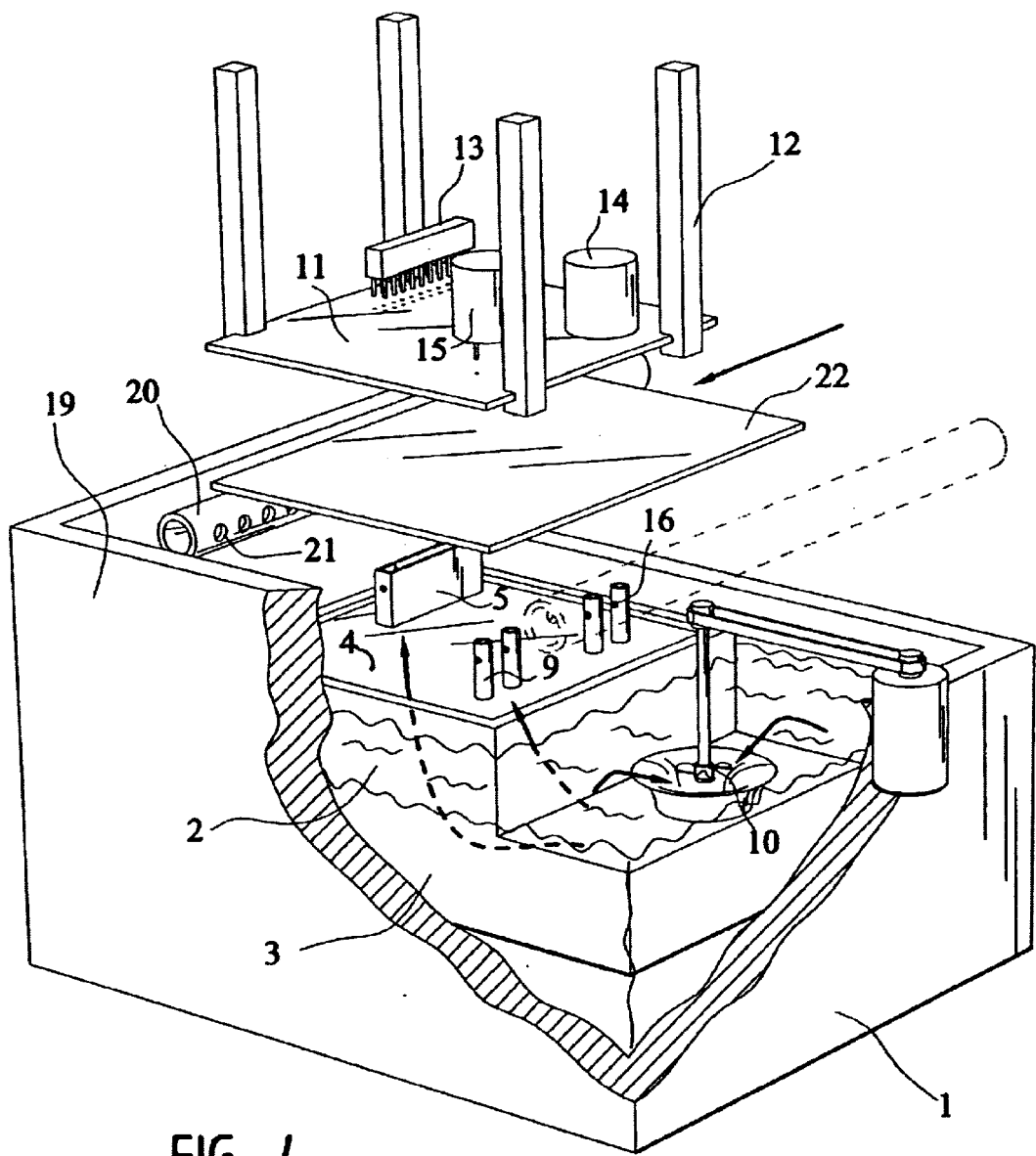
FIG. 4 is a schematic view of a specific embodiment of the present invention.

As shown in FIG. 4, solder from soldering vessel 1 is pumped by means of a pump 10 into solder tank 3. The solder will then exit at the upper side of tubes 5–9. In order to make a soldered connection a printed circuit board 11 for soldering is moved to a position above plate 4 by means of a transporting device, of which only grippers 12 are drawn. Depending on the interaction between the material from which tubes 5–9 are manufactured and the solder a convex, flat or concave meniscus is made. The printed circuit board 11 must therefore be moved to, a position a short distance from the top of tubes 5–9 or making contact with tubes 5–9.

Printed circuit board 11 is provided with a large number of small components arranged by means of reflow soldering. Further arranged on circuit board 11 is a connector 13 and two electrolytic condensers 14, 15. Tubes 5–9 are herein placed such that through the holes arranged in the circuit board they enclose the connecting wires of connector 13 and electrolytic condensers 14 and 15. The soldering process will take place by feeding solder to the tubes. Openings 16 arranged in tubes 5–9 herein provide a constant flow of solder in the lower part of the tubes so that heat is supplied continuously to the upper part of the tubes and a sufficiently strong soldered connection is created. It is this which enables the freedom of design of the printed circuit board. Possible components arranged on the underside of the printed circuit board are generally placed higher than outflow openings 16, so that the flow of solder exiting from outflow openings 16 does not damage the components.

As already stated in the preamble, it is attractive to briefly increase the capacity of the pump shortly before the soldering process in order to thereby enhance the flow of solder and to ensure that sufficient heat and fresh solder is supplied to the upper part of the tubes.

After the soldering process it is attractive to decrease the capacity of the pump to facilitate release of the solder between the tubes and the printed circuit board. This prevents bridge-formation.

Figure 3:
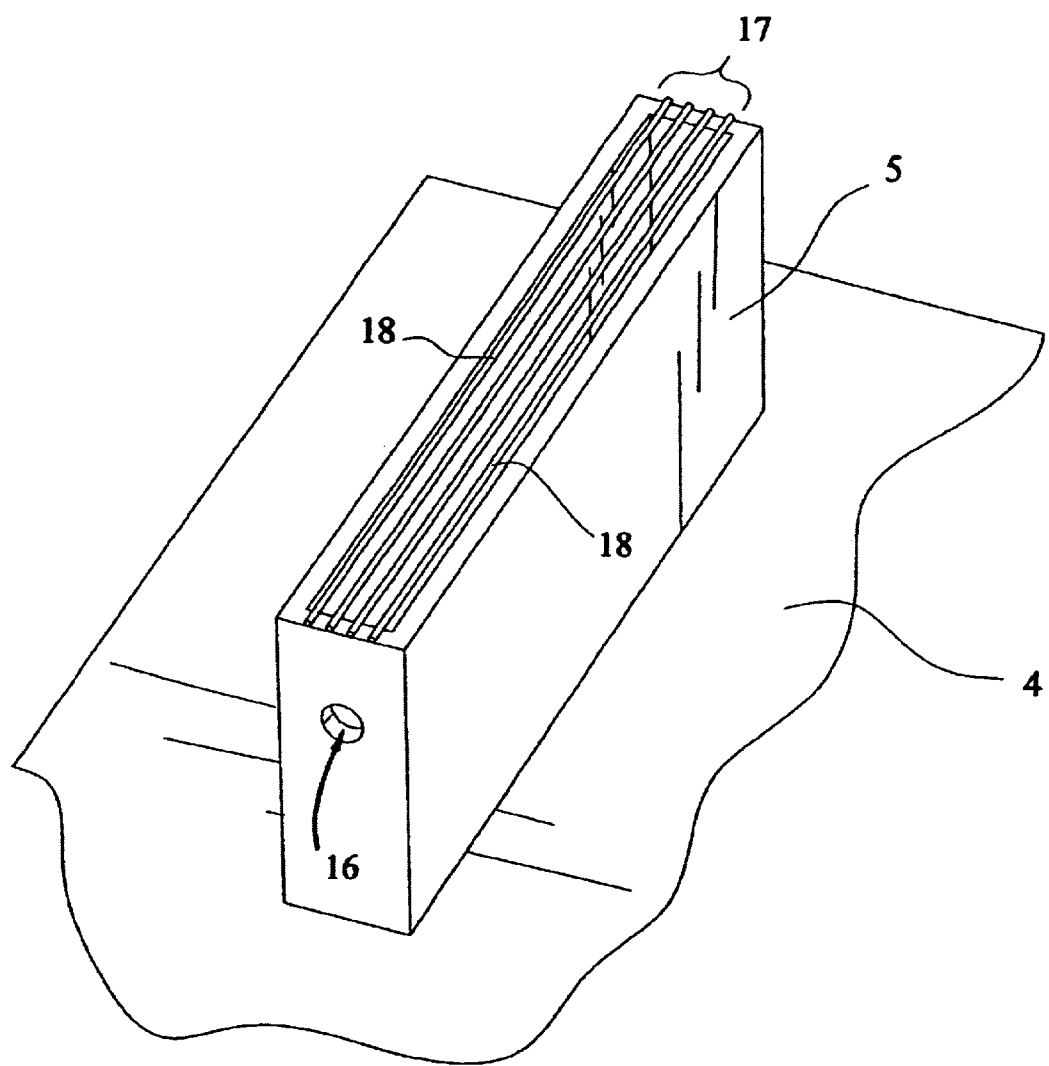
FIG. 3 shows a detail view of a tube for use in the apparatus according to the present invention.

Another measure preventing bridge-formation is the placing of a grid on the top side of the tubes. FIG. 3 shows an embodiment of a tube 5 provided on its top with a grid 17. Grid 17 is formed in the present case by four wires. Instead of the wires 18 shown here of which the grid 17 consists it is also possible to apply other forms, for instance a mesh-like structure.

It is also recommended that such a selective soldering process according to the present invention is performed in a low-oxygen, for instance nitrogen atmosphere. It is possible for this purpose, as shown in FIG. 4, to make use of elevated side walls 19 of soldering vessel 1, wherein at least one nitrogen feed pipe 20 is arranged. Apertures 21 are arranged herein for fine distribution of the nitrogen. To prevent escape of nitrogen the space above soldering vessel 1 is normally covered by a plate 22. Shortly before performing a soldering operation the plate 22 can be removed laterally by means of a transport mechanism (not shown). Immediately thereafter the transporting means carry the printed circuit board 11 for soldering to its position, whereafter the soldering process takes place. After completion of the soldering process the soldered circuit board 11 is once again removed and plate 22 is once again returned to its position.

Figure 5:
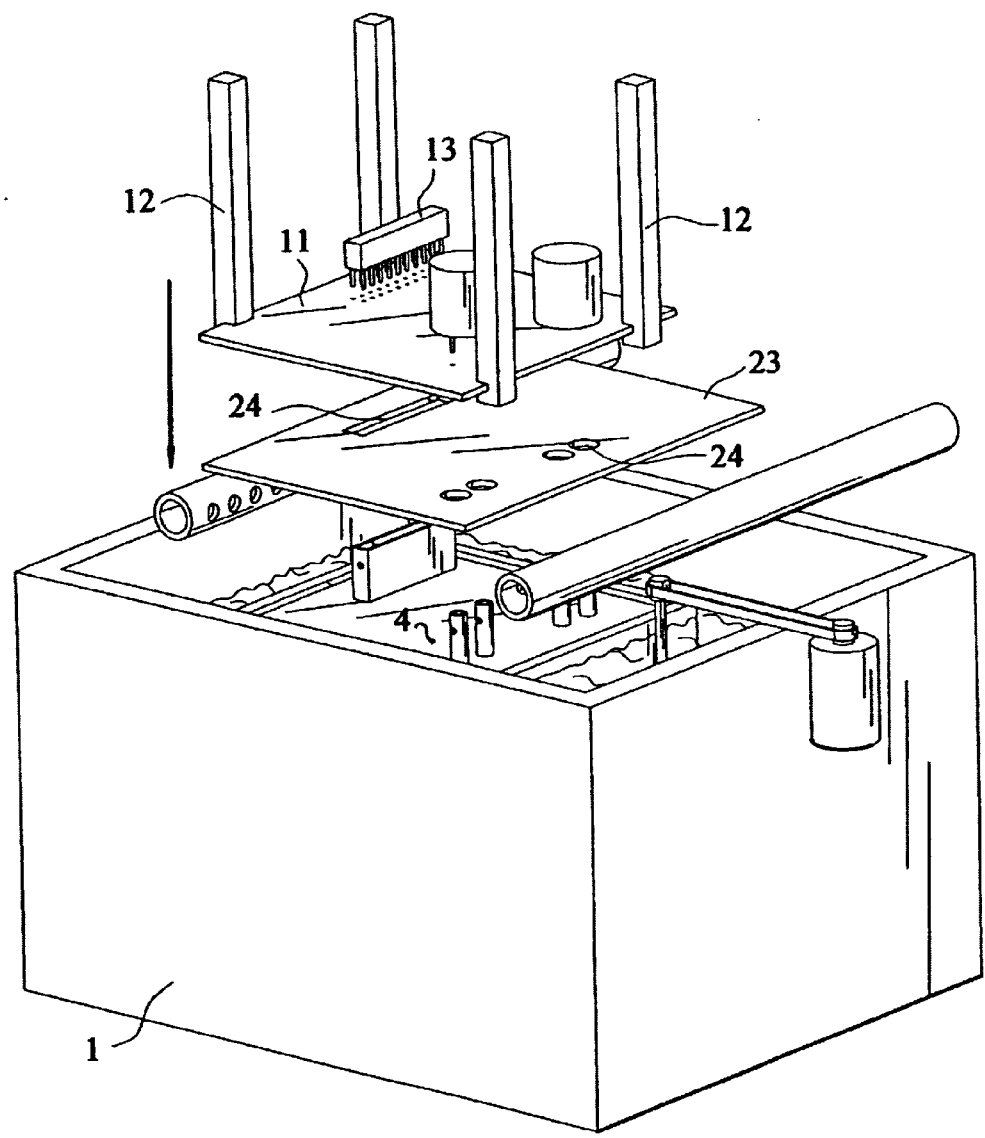
FIG. 5 is a schematic view of another specific embodiment of the present invention.

Another configuration is shown in FIG. 5. A cover plate is likewise present here, although in the present case the cover plate 23 is provided with openings 24 at the position of tubes 5–9. Plate 23 is herein movable in vertical direction so that shortly before soldering of the printed circuit board the plate 23 is moved downward so that the upper parts of tubes 5–9 are left clear and the soldering process can take place. After the soldering process the plate 23 is moved upward again. Situated on the periphery of plate 23 is a gasket (not shown) which serves to prevent the supplied nitrogen from flowing away between the solder in vessel 1 and plate 23.

Figure 6:
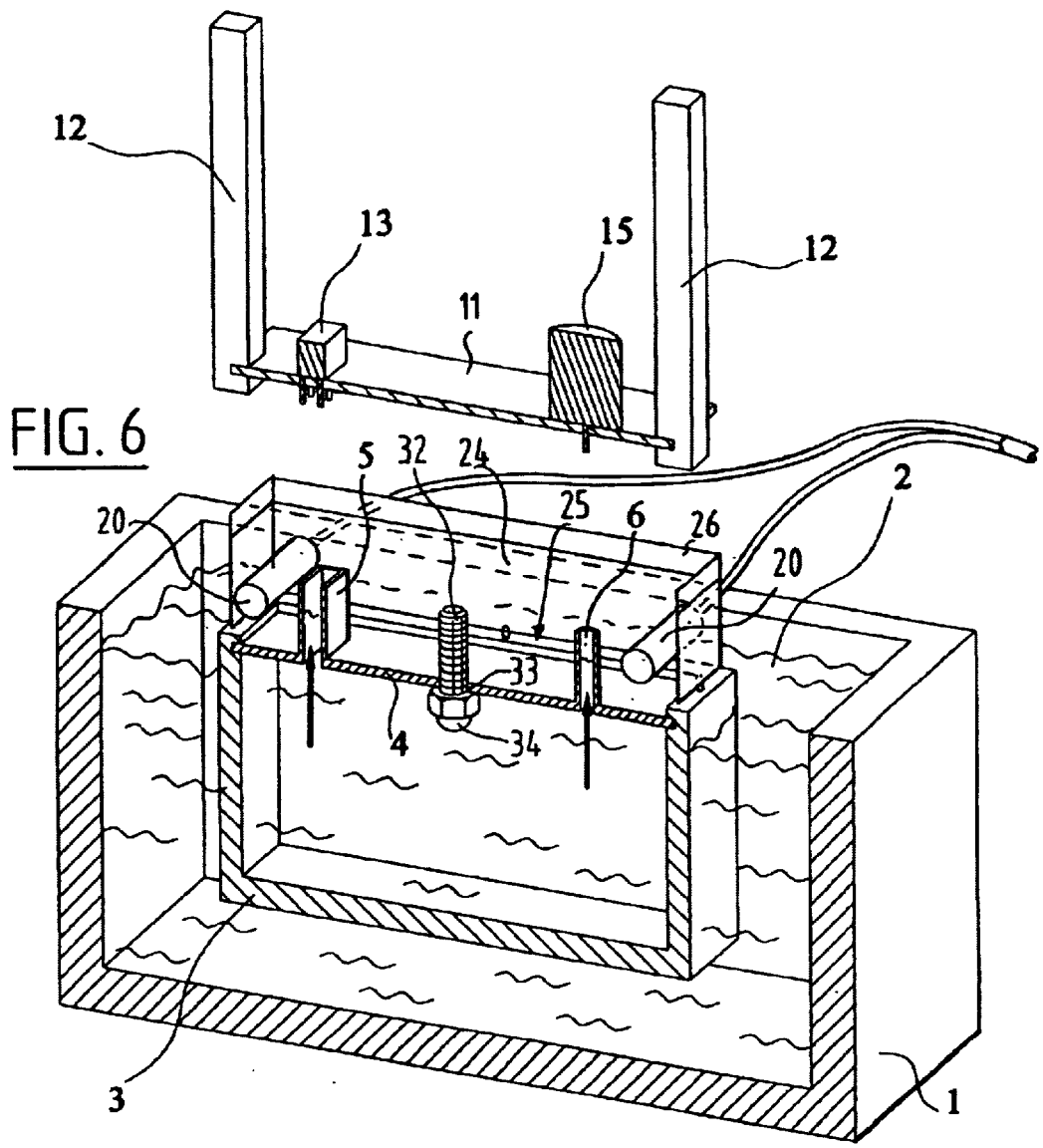
FIG. 6 is a view corresponding with FIG. 2 of a second specific embodiment of the present invention.

FIG. 6 shows an embodiment which is provided with a screen 24. Screen 24 serves to confine the low-oxygen gas, such as nitrogen, supplied by gas feed pipes 20. The space enclosed by screen 24 is herein bounded at the top by the printed circuit board for soldering.

In order to obtain a good connection between the screen and the printed circuit board the upper part 26 of the screen is preferably manufactured from flexible material. A gap 25 is preferably arranged between the screen and the upper edge of solder tank 3 to compensate the supplied. volume of solder.

In order to perform a soldering operation in this configuration, the printed circuit board for soldering is carried into the soldering position, whereby the space enclosed by the screen is largely closed. Low-oxygen gas such as nitrogen is subsequently allowed to flow into this space via the diffusers, the soldering operation is then carried out and the soldered printed circuit board is removed.

As already stated in the introduction, it is important to temporarily increase the pump capacity prior to the soldering operation so as to refresh the solder present in the tubes to increase the temperature of the solder in the tube and flush away the oxide layer of the solder. This preferably takes place during feed of the nitrogen. The soldering operation is carried out after this increase in the pump capacity. The pump capacity is herein lower than during the "flushing" but higher than in the rest position. The pump capacity must then be sufficiently great to push the solder to the upper part of the tubes, wherein a part of the stream flows away laterally via the openings. After the soldering process the pump capacity is returned to the value at rest and the soldered printed circuit board removed.

A spacer 32 is further arranged on plate 4 in the form of a pin or threaded end. This is used to precisely determine the distance between the upper part of tubes 5 and printed circuit board 11.

The spacer is adjustable to enable setting of this distance. A hole 33 provided with screw thread is drilled into plate 4 for this purpose. A length can be adjusted by making use of a threaded end, and the length can be fixed by means of a capped nut 34 on the underside acting as lock nut.

Figure 7:
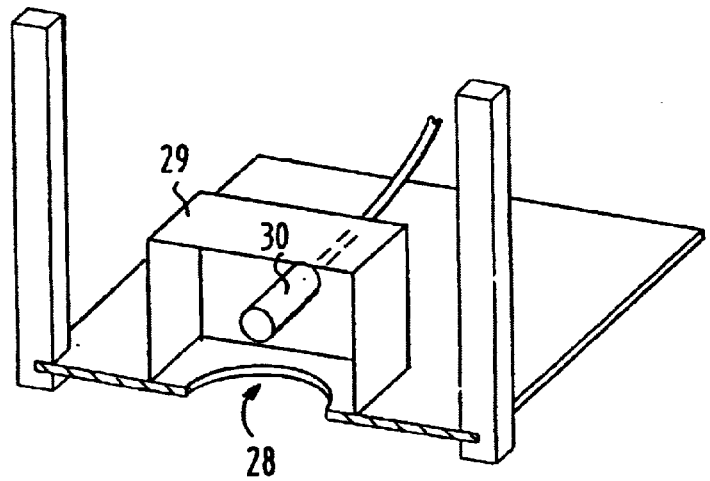
FIG. 7 is a detail view of a variant of the embodiment shown in FIG. 5.

Printed circuit boards are usually provided with apertures, such as for passage of the neck of a cathode ray tube. These apertures interfere with the confining action of the printed circuit board. According to a preferred embodiment as shown in FIG. 7, there is placed over the aperture 28 in a printed circuit board a box 29 which provides the closure relative to the environment. A diffusor 30 for supplying low-oxygen gas is placed in box 29. The volume to be filled is now after all larger, so that the additional capacity of an extra diffusor is necessary to ensure a sufficiently rapid filling. It is otherwise also possible, when more holes are for instance arranged in a printed circuit board, to make use of a box 29 which is larger and which extends over the whole printed circuit board.

It will be apparent that other diverse modifications can be made to the embodiment shown here.

What is claimed is:

1. Soldering apparatus, comprising:

a vessel for containing and heating molten solder;

transporting means for transporting objects for soldering onto the vessel and removing said objects;

at least one tube extending substantially vertically above the soldering vessel;

pump means for feeding molten solder to the underside of the tube; and moving means for moving into at least the vicinity of each other the underside of the printed circuit board for soldering and the upper side of the tube, characterized in that an outflow opening is arranged in each of the tubes at some distance from the upper side of said tubes.

2. Soldering apparatus as claimed in claim 1, characterized in that the moving means are adapted to cause the upper side of the tube to contact the underside of the objects for soldering.

3. Soldering apparatus as claimed in claim 1, characterized in that the number of tubes is greater than one and that each of the tubes is fixed with its underside to the same substantially horizontal plate.

4. Soldering apparatus as claimed in claim 3, characterized in that a number of spacers are placed on the plate.

5. Soldering apparatus as claimed in claim 4, characterized in that the height of the spacers is adjustable.

6. Soldering apparatus as claimed in claim 1, characterized in that the pump means are adapted to temporarily increase the pump capacity during a soldering operation.

7. Soldering apparatus as claimed in claim 6, characterized in that the pump means are adapted to temporarily increase the pump capacity prior to soldering.

8. Soldering apparatus as claimed in claim 1, characterized in that the size of the outflow openings is adjustable.

9. Soldering apparatus as claimed in claim 8, characterized in that a sleeve is arranged around or inside at least one of the tubes with an adjustable outflow opening, which sleeve extends at least over the outflow opening, that the sleeve is provided with an opening and that the sleeve is movable between a position in which the opening in the sleeve coincides with the outflow opening and a position in which the opening in the sleeve at least partially covers the outflow opening.

10. Soldering apparatus as claimed in claim 1, characterized in that the upper side of the tubes is covered with a grid.

11. Soldering apparatus as claimed in claim 10, characterized in that the openings in the grid coincide with the soldering points of the object for soldering.

12. Soldering apparatus as claimed in claim 10, characterized in that the grid is formed by wires.

13. Soldering apparatus as claimed in claim 3, characterized in that the plate is divided into separate elements which are individually exchangeable.

14. Soldering apparatus as claimed in claim 13, characterized in that the elements of the plate are placed on a frame.

15. Soldering apparatus as claimed in claim 1, characterized in that supply means for low-oxygen gas are arranged in the vicinity of the soldering vessel.

16. Soldering apparatus as claimed in claim 15, characterized in that a cover plate is arranged above said supply means, which cover plate is removable when a soldering operation is performed.

17. Soldering apparatus as claimed in claim 16, characterized in that the cover plate is provided with openings and that the cover plate is vertically movable to a position below the level of the upper part of the tubes.

18. Soldering apparatus as claimed in claim 17, characterized in that around the supply means there is placed a screen, the upper edge of which corresponds with the contour of the printed circuit board for soldering.

19. Soldering apparatus as claimed in claim 18, characterized in that the upper edge of the screen is manufactured from flexible material.

20. Soldering apparatus as claimed in claim 18, characterized in that a gap is formed between the screen and the solder bath.

21. Solder apparatus as claimed in claim 1, characterized in that a plate is provided with a number of tubes fixed thereon.

22. Solder apparatus as claimed in claim 13, characterized in that a plate is provided with a number of tubes fixed thereon.

* * * * *